United States Patent [19]

Nakatani et al.

[11] Patent Number: 4,863,683

[45] Date of Patent: Sep. 5, 1989

[54] CONDUCTOR PASTE AND METHOD OF MANUFACTURING A MULTILAYERED CERAMIC BODY USING THE PASTE

[75] Inventors: Seiichi Nakatani, Neyagawa; Satoru Yuhaku, Osaka; Hideyuki Okinaka, Toyonaka; Toru Ishida; Osamu Makino, both of Hirakata; Tatsuro Kikuchi, Kyoto, all of Japan

[73] Assignee: Matsushita Electric Industrial Co., Ltd., Osaka, Japan

[21] Appl. No.: 66,182

[22] Filed: Jun. 24, 1987

Related U.S. Application Data

[62] Division of Ser. No. 756,081, Jul. 17, 1985, Pat. No. 4,714,570.

[30] Foreign Application Priority Data

| Jul. 17, 1984 | [JP] | Japan | 59-147832 |
| Jul. 17, 1984 | [JP] | Japan | 59-147833 |
| Sep. 6, 1984 | [JP] | Japan | 59-186777 |
| Sep. 6, 1984 | [JP] | Japan | 59-186775 |
| Feb. 8, 1985 | [JP] | Japan | 60-23846 |
| Feb. 8, 1985 | [JP] | Japan | 60-23845 |
| Feb. 8, 1985 | [JP] | Japan | 60-23844 |

[51] Int. Cl.[4] .................. H01B 1/06; C22C 32/00
[52] U.S. Cl. .................. 419/10; 419/19; 419/53; 419/54; 419/57; 419/58; 156/89; 252/518; 252/519; 252/512; 252/513
[58] Field of Search .......... 252/518, 519, 512, 513; 106/1.23, 1.26, 1.27; 156/89; 419/53, 10, 54, 19, 57, 58; 361/402, 409, 411; 427/96, 123, 126.3, 126.6; 264/61, 63, 65, 66, 67

[56] References Cited

U.S. PATENT DOCUMENTS

| 2,993,815 | 7/1961 | Trepton | 252/512 |
| 4,070,518 | 1/1978 | Hoffman | 252/518 |
| 4,072,771 | 2/1978 | Grier | 427/126.2 |
| 4,172,919 | 10/1979 | Mitchell | 106/1.23 |
| 4,322,316 | 3/1982 | Provance et al. | 252/518 |
| 4,514,321 | 4/1985 | Suita | 252/518 |
| 4,521,329 | 6/1985 | Suita et al. | 252/518 |

Primary Examiner—Josephine Barr
Attorney, Agent, or Firm—Wenderoth, Lind & Ponack

[57] ABSTRACT

A manufacturing method for a multilayered ceramic body using Cu, Ni, Co or Fe as a conductor material, and a conductor forming paste of particular composition of CuO, NiO, CoO or $Fe_2O_3$ as the main component, the paste being applied to the multilayered body. The manufacturing method comprises: a process of forming the multilayered body with conductor paste of CuO, NiO, CoO or $Fe_2O_3$ as the main component and insulating paste formed of glass and/or ceramic, so that a binder is removed from the laminate by heat treatment in an oxidizing atmosphere; a process of heat treatment for reducing the oxide; and a sintering process for sintering the laminate in a nitrogen atmosphere.

35 Claims, 3 Drawing Sheets

CONDUCTOR PASTE AND METHOD OF MANUFACTURING A MULTILAYERED CERAMIC BODY USING THE PASTE

This is a Rule 60 divisional application of Ser. No. 756,081, filed July 17, 1985 now U.S. Pat. No. 4,714,570.

BACKGROUND OF THE INVENTION

1. Field of the Invention

This invention relates to a manufacturing method for a multilayered ceramic body, such as a multilayer ceramic substrate, for mounting thereon semiconductor ICs and chips and for interconnecting them with each other, and to a metalized composition for the multilayered ceramic body.

2. Description of the Prior Art

The known multilayer ceramic substrate manufacturing methods are classified into three: types: ① a thick film method, ② a green sheet printing method and ③ a green sheet laminating method. Next, these methods will be described briefly. At first, the thick film method is represented by the hybrid IC, which employs thick film paste of conductors and insulators and repeatedly applies to an already sintered ceramic substrate the screen process printing and baking to thereby form patterns. This method is relatively easy to perform because the thick film paste is readily obtainable and the method itself is simple, thereby being now widely practiced. The thick film method, however, uses glass as the insulating layer and is not so much multilayered, thereby being limited to three to four layers. The screen process printing and firing are repeated for multilayering each layer to result in that a long lead time and a high manufacturing cost. Also, the use of the sintered substrate will create a defect in that the through hole processing is difficult.

Next, the green sheet printing method uses a ceramic sheet which is fabricated by the following process. A ceramic powder (e.g. alumina or beryllia as the main component) added with an organic binder, a plasticizer and a solvent, formed in slurry by use of a ball mill, and is formed in a sheet-like film (called the green sheet) by means of the doctor blade. The conductor paste uses high melting point metal, such as tungsten (W), molybdenum (Mo) or molybdenum-manganese (Mo-Mn), and the insulating layer paste uses paste using an inorganic component having the same composition as the green sheet material. In this method, the conductor paste and insulator paste are printed alternately on the green sheet to be multilayered, and after being printed and dried, the sintering is carried out at once, at which time the sintering is usually carried out under a reducing atmosphere in which the high melting point metal is not oxidized, for example, 96% alumina is sintered a temperature of 1600° C. The reducing atmosphere usually contains nitrogen and some water vapor gasses including hydrogen gas of concentration of about 10% (as disclosed in, for example, "A FABRICATION TECHNIQUE FOR MULTILAYER CERAMIC MODULES", Solid State Technology 15, No. 5, P 35~40 (May, 1972)).

Such green sheet method is very advantageous and is expected to be widely used in the future. Its advantages are as follows: Firstly, the sintering is carried out at once after the sheet is printed and multilayered to thereby reduce manufacturing time. Secondly, the insulating layers are the same in composition as the substrate material and are sintered simultaneously so that a dense sintered body superior in thermal conductivity and airtightness is obtainable. Thirdly, the use of green sheet increases the processability, such as the through hole processing and is superior in fine printing efficiency. Fourthly, the use of metal, such as W, Mo or Mo-Mn, lowers material cost in comparison with Au or Ag/Pd series conductor material. Fifthly, the sintered body is shrunk when sintered, thereby being actually higher in fine line printing. Sixthly, adhesion strength of conductor layer is larger than that in the thick film method. The green sheet method, however, is defective in that a large design change is difficult, it is dangerous to be processed at a high temperature and to require a hydrogen atmosphere, resulting in a high fabrication cost, and the conductor is higher in electrical resistance than Au, Ag or Cu and not to be soldered, thereby requiring the surface treatment for plating Ni or Au on the surface.

The green sheet laminating method is similar to the green sheet printing method, but is different in the multilayering process of laminating a number of green sheet printed conductors and formed through holes.

This method is effective for a large number of laminations, but requires molds or jigs as many as the laminations for the through hole processing to the green sheet and is low in degree of freedom for design change, thereby having been not as popular as the green sheet printing method.

Next, paying attention to the metallized conductive material used for the ceramic substrate, the thick film method uses Au, Ag/Pd or Cu, and the green sheet method W, Mo or Mo-Mn. The Au and Ag/Pd are fired in air, but the method is expensive due to noble metals. Also, the green sheet method, which sinters the ceramic substrate at a high temperature of 1500° C. or more, thereby create a problem in that the high melting point metal, such as W, Mo, or Mo-Mn, only is usable. Hence, at present, a Cu metallized substrate has been noted which is low in conductor resistance, generates no migration phenomenon, and is good in soldering. Thus, the Cu metallized wiring substrate is already put into practical use, But, there is a drawback in the Cu metallized substrate because of using the base-metal. The reason for the above is that said base metal, when fired in air, is oxidized not to obtain the conductivity, and that in order to obtain the adhesive property, sheet resistance, and soldering property of the wiring and to eliminate decomposition of organic binder in the paste, very delicate atmosphere control of including some oxygen in the nitrogen atmosphere is required.

Furthermore, in the case where a glazed resistor and a dielectric are formed after the Cu conductor is formed, a firing atmosphere the same as the above-mentioned one is required. However, such resistor and dielectric usable in this condition are rare and the degree of freedom for selection is very little. Nevertheless, the merit of the base metal conductor material represented by Cu is attractive.

Now, in consideration of the future of the multilayer substrate, it will be ideal to use the base metal material as the conductor material and to utilize the green sheet method for the multilayer method. In other words, a base metal conductor, such as copper, is printed on the green sheet and the insulating layer is printed or laminated in multilayers so as to obtain the multilayer substrate.

However, there are some problems to be solved in order to put the base metal multilayer substrate into practical use. A first problem is created in that since the melting point of Cu, the typical base metal, is low at a temperature of 1083° C., it is necessary for sintering simultaneously with the substrate material to keep the sintering temperature thereof lower than the aforesaid melting point. This is indispensable in order to satisfy requirements as to mechanical strength of sintered body, dielectric strength (or break-down voltage), moisture resistance and thermal conductivity of the substrate material. Further the performance, such as the metallizing property of the Cu, is required when multi-layered. A second problem is that it may be difficult to use the binder under such sintering condition of temperature or atmosphere. In other words, the organic binder used for the sheet or the paste has the property of not decomposing in a non-oxidizing atmosphere. Unless the binder is completely decomposed and removed, the ceramic body itself remains porous, whereby not only the sintering does not proceed but also the substrate becomes blackish due to the residual carbon is merely obtained.

For the aforesaid simultaneously sintering substrate material, glass-ceramic material has generally been developed, which has been disclosed in, for example, the U.S. Pat. No. 449564, No. 449569 and No. 875703, the decomposition and removal of the binder having been disclosed in the Japanese Laid-open patent application No. 55-128899.

SUMMARY OF THE INVENTION

An object of the invention is to provide a method for manufacturing a multilayer ceramic body using a base metal as a conductor material.

Another object of the invention is to provide a conductor paste which improves the metallization performance (junction strength with the substrate material) of base metal (Co, Ni, Fe, or Cu) applied to the ceramic laminate body.

Therefore, it is possible to obtain a high density sintered body of a low manufacturing cost, of high reliability of the metallization performance even in the multi-layer construction.

In order to attain the above objects, a multilayered ceramic body manufacturing method of the invention comprises: a process of forming a pattern by a conductor paste composition of base metal oxide, such as CoO, NiO, $Fe_2O_3$ and CuO, as a main component, on a green sheet comprising glass, ceramic or a mixture thereof, so that these green sheets are integrally laminated in a desired number, or a process of forming a not-sintered multilayered body by printing in thick film the conductor paste and insulator paste on the green sheet having the pattern formed and then multilayering, or a process of carrying out the thick film printing by use of the conductor paste composition of the main components of base metal oxide, such as CoO, NiO, $Fe_2O_3$ or CuO, and the insulating paste composition comprising glass, ceramic or a mixture thereof, on the sintered substrate of glass, ceramic or a mixture thereof, thereby forming a not-sintered multilayered body; a process of applying to the non-sintered multilayered body a heat treatment at a temperature lower than the melting point of the glass composition of the insulating compositions and in an oxidizing atmosphere with respect to carbon; a process of applying to the non-sintered body a heat treatment in an atmosphere of a mixed gas of hydrogen and nitrogen at a temperature more than that necessary to reduce the cupric oxide to metallic copper and at a temperature lower than the melting point of the glass composition of the insulating compositions; and a process of firing the multilayered body with a reducing treatment in an atmosphere of nitrogen at a temperature necessary to sinter the insulating compositions.

These and other objects of the invention will become more apparent in the detailed description and examples which follow.

DETAILED DESCRIPTION OF THE PREFERRED EMBODIMENT

Figure 1:
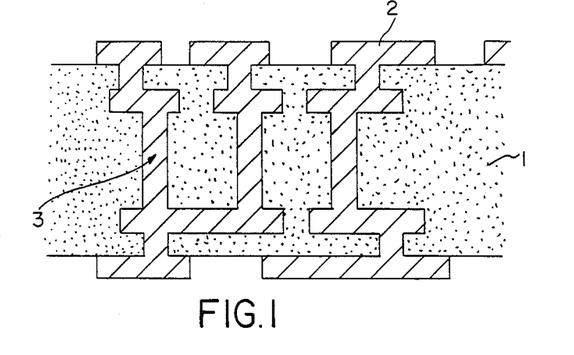
FIG. 1 is a sectional view of an embodiment of a ceramic laminate body of the invention.

FIG. 1 is a sectional view of an embodiment of a base metal multilayer substrate manufactured by a metallizing method of the invention, in which reference numeral 1 designates a low temperature sintered substrate compound of glass or ceramic, 2 designates a base metal metallized layer obtained by the metallizing method of the invention, and 3 designates a through hole portion at the glass-ceramic substrate.

It is not easy to obtain a metallized multilayer substrate of base metal, such as Co, Ni, Fe or Cu, as shown in FIG. 1. Such structure is obtained in such a manner that on the conventional green sheet comprising a low temperature sintered insulating material and an organic binder, such as polyvinyl butyral, the conductor paste of Co, Ni, Fe or Cu is printed, so that a plurality of green sheets are laminated and bonded integrally with each other by use of heat and pressure to thereby form a multilayered body, or insulating paste having the same composition as the inorganic component of the green sheet and the base metal paste are subjected repeatedly alternately to printing and drying to thereby obtain a multilayered body, which is fired in a nitrogen atmosphere. However, it may be difficult to use the organic binder for the firing in nitrogen, because the organic binder included in the green sheet or the insulating paste is difficult to completely remove by thermal decomposition in the non-oxidizing atmosphere and at a temperature of sintering glass-ceramic. It is well known that although most of the binder is removed, a small part of the binder remains in the form of carbon. The residual carbon largely affects the sintering of the glass-ceramic material so that a dense sintered body is not obtainable. Hence, in actual firing, it is necessary for removal of the binder, to add some oxygen from the atmosphere to thereby promote decomposition of binder.

While, when the oxygen (or air) to be added is too much, oxidization of base metal occurs, whereby the firing atmosphere requires delicate control.

The present invention aims at compatibility of steps for the removal of binder and metallization of base metal. In other words, the method of the invention forms the base metal material, such as Co, Ni, Fe or Cu, into paste as oxide, which is used as the starting material for the conductor material, and utilizes the glass-/ceramic low temperature sintered material for the insulating material and forms a multilayer body. Next, the multilayered body is subjected to a heat treatment in an oxidizing atmosphere, such as air or oxygen, thereby removing the organic binder. It is then subjected to heat treatment for reducing the base metal oxide, and thereafter the insulating material is applied with heat treatment for the sintering in the nitrogen atmosphere.

Next, an explanation will be given on the reason for realizing the above. At first, regarding the binder removing process, according to the method of the invention, since the base metal oxide to be metallized is used, under the thermal treatment even in air, the oxide causes no change in volume, and only thermal decomposition of organic binder is carried out, at which time the thermal decomposition should be carried out at a temperature lower than the softening point of the glass composition of glass-ceramic material used as the insulating material. The reason for this is that when sintering of the laminate comprising the base metal oxide and insulating material proceeds in excess, the base metal is sealed as the oxide inside the multilayered body and is not reduced even in the subsequent reduction process and also the oxide proceeds to rapidly diffuse into the insulating layer, thereby not maintaining the electric insulation property, at which time the metallizing material usable is limited and not effective other than Co, Ni, Fe and Cu, because oxides of these metals exist stably even at a temperature of enabling the binder to be removed. For example, the base metal, such as W and Mo, can be present at a state of oxide $WO_3$ or $MoO_3$, but will sublimate at the temperature and in the atmosphere as above-mentioned, thereby not being present in the laminated body, which is not effective for the method of the invention.

Also, in a case where the volume change and unnecessary diffusion are caused by unnecessary crystal transformation in the aforesaid temperature region even for the oxide of Co, Ni, Fe or Cu, the body also cannot be constructed. Therefore, it is desired in the multilayered method of the invention, to employ CoO, NiO, $\alpha$-$Fe_2O_3$ or CuO as the oxide of Co, Ni, Fe or Cu. In other words, such oxide is stable even in air so that even when the temperature is raised in this condition, no crystal transformation occurs and also particle sizes of the powder are selected to enable control of shrinkage rate, thereby enabling one to make the multilayered body integrally with glass-ceramic and metal.

In addition, in the case of using an oxide, for example, $Cu_2O$ other than the above oxide, which may form CuO depending on the temperature rise in the air so as to cause change in volume, but is said to exist as $Cu_2O$ in a range of $10^{-3}$ to $10^{-5}$ of partial pressure of oxygen, thereby enabling thermal decomposition of organic binder. The oxygen partial pressure, however, is difficult to control as above-mentioned, which does not satisfy the purpose of the invention.

Secondly, regarding the reduction process, the base metal oxide of the invention is reduced at a low temperature so as to be metal. Hence, it is possible to end the reduction at a temperature lower than the softening point of the glass-ceramic composition, resulting in the fact that the inside oxide of the not-sintered body is sufficiently reduced. At this time, the usable insulating material is limited i.e. it is required to be constituted of the chemically inactive component against the base metal conductor, because the glass-ceramic material including a metal oxide, e.g., PbO, will create a reaction given by the following chemical formula.

$$PbO + aMe \rightarrow Pb + Me_aO$$

whereby the base metal material is oxidized to form an insulating material. Furthermore, the insulator layer including Pb metal cannot demonstrate its function as the insulator. Accordingly, when Co, Ni, Fe or Cu is used as the base metal conductor, the insulating material in the order to be stable thermodynamically and free from oxidation and reduction reactions against these elements, is required to be selected from $Al_2O_3$, BaO, $B_2O_3$, $SiO_2$, CaO, MgO, $Na_2O$, $Ta_2O_5$, $Nb_2O_5$, $Li_2O$ and $K_2O$.

Thirdly, regarding the firing process, the binder has already been removed, whereby sintering of insulating material and metallization of base metal need only be considered. In other words, they are heated at a temperature up to the sintering temperature of glass-ceramic and in the nitrogen gas atmosphere to so that no oxidization of the base metal occurs, preferably, in the atmosphere of nitrogen gas of $O_2$ concentration of 30 to 40 ppm or less. As a result of the glass-ceramic sintering and base metal particle sintering, good metallization can be obtained. At this time, however, in the case of firing the base metal not in the neutral atmosphere, such as nitrogen, but in the reducing atmosphere, sufficient metallization is not obtainable, because the atmosphere largely affects to the wettability of the base metal to the glass-ceramic material, in other words, on the basis of the fact that glass in the insulator layer is generally of poor wettability to metal. An oxide generally exhibits a good wettability to metal. Hence a good wettability of oxide is realized to carry out sintering in the neutral atmosphere making it easy to provide an extremely thin film on the surface of the aforesaid metal.

The bae metal Co, Ni, Fe or Cu used in this invention is not only used independently but also in desired combination so as to be effective, because the combination, as seen from the drawing, entirely forms a solid solution at all percentages, so that combinations of Cu-Ni, Cu-Co, Cu-Fe and Ni-Co do not lower the melting point below the respective melting points, those of Co-Fe and Ni-Fe nearly lowering the melting points thereof. Hence, it is also effective to control the sintering temperature by combination of particles of metal and constitute alloyed wirings thereby. Also, it is effective for the multilayer wirings to desirably select the wiring conductor at each layer with Co, Ni, Fe or Cu. But preferably the uppermost layer wiring should employ Ni or Cu which is superior in soldering efficiency.

Also, we have found that in the metallization of the invention, it is remarkably effective to add $Bi_2O_3$, CdO, $MnO_2$ or $Al_2O_3$ to each base metal oxide of CoO, NiO, $Fe_2O_3$ or CuO for improving the metallization properties such as adhesion strength, and it is further effective to add glass powder to the above. At this time, $Bi_2O_3$, CdO and $MnO_2$ react with the base metal oxide to improve bondability with the insulating material, so that $Al_2O_3$ is of good wettability to the glass composition in insulating material to be bonded thereto. The glass powder to be added is the same as the aforesaid insulating material and should be thermodynamically stable even in the reducing atmosphere, so as not to create the oxidization and reduction reaction on the base metal. For this, it has been found that the glass powder having a composition selected from BaO, $B_2O_3$, CaO, MgO, $Al_2O_3$ and $SiO_2$ is optimum.

In addition, the metallization method of the invention of course is not limited to the ceramic multilayer wiring substrate, but applicable to metallization of the multilayer ceramic capacitor, or that of Fe-Ni series magnetic material to the ceramic substrate.

Next, some Examples will be detailed in the following description.

EXAMPLE 1

The ceramic substrate material used borosilicated glass powder (mean particle size: 3 μm) and alumina powder ($Al_2O_3$, mean particle size: 1 μm) as shown in the Table 1, which are blended in a ratio of 40 to 60 weight %.

TABLE 1

| Component | Weight % |
| --- | --- |
| $SiO_2$ | 68 |
| $Al_2O_3$ | 3 |
| $B_2O_3$ | 19 |
| $Na_2O$ | 0.2 |
| $K_2O$ | 8.8 |
| $Li_2O$ | 1.0 |

The mixed powder was used as an inorganic component for the substrate material, polyvinyl butyral as an organic binder, di-n-butyl phthalate as a plasticizer, and a mixture (in a ratio of 30 to 40) of toluene and isopropyl alcohol as a solvent, which were mixed in composition shown in Table 2 and slurried.

TABLE 2

| Component | Mixing Ratio | Weight |
| --- | --- | --- |
| Inorganic Component | 100 parts | 20 kg |
| Polyvinyl Butyral | 5 parts | 1 kg |
| Di-n-Butyl Phthalate | 5 parts | 1 kg |
| Toluene/Isopropyl Alcohol | 40 parts | 8 kg |

Figure 3:
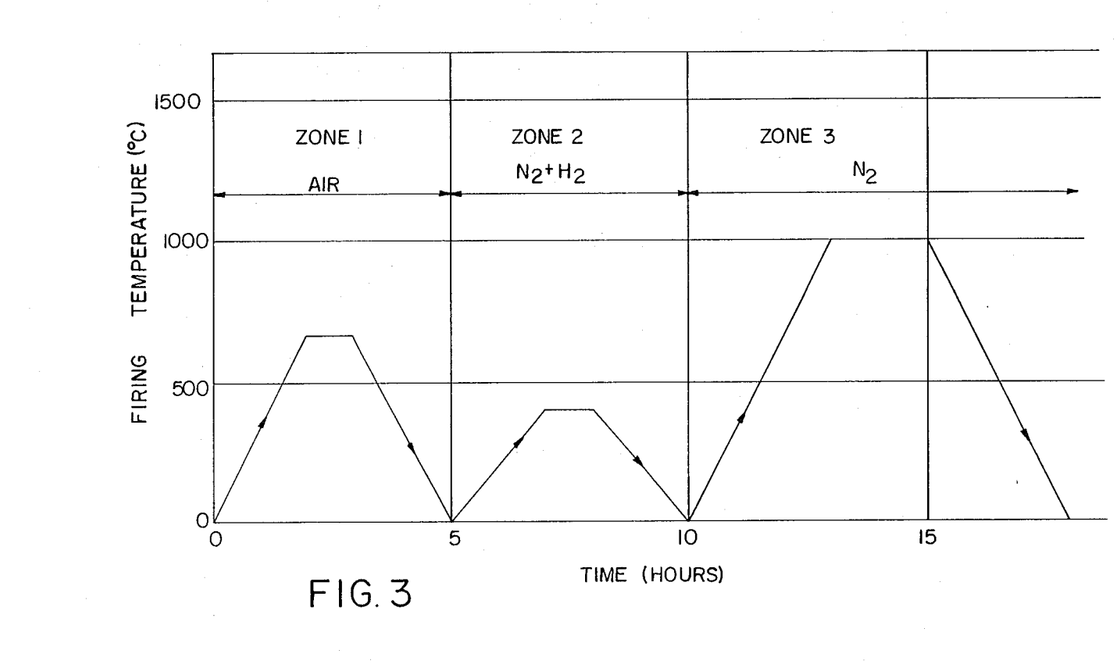
FIG. 3 is a graph exemplary of the temperature and atmosphere profile of the binder removing process, reduction process, and sintering process, in the manufacturing method of the invention.

This slurry was sheet-molded by the doctor blade method on an organic film (Rumiller ® 125 μm thick), at which time the system was used which carries out in continuation the processes of making a film, drying, punching into a desired sheet form, and through hole processing at need. The not-sintered substrate obtained as above-mentioned is called the green sheet. The green sheet obtained is sintered at a temperature of 1000° C. in air for one hour to be a dense sintered body, whose electric performance is such that the dielectric constant is 7.5, the dielectric loss 0.15% (1 MHz), and flexural strength of 20 kg/mm², the performance being of value to nearly satisfy the requirements for a substrate material. Next, CuO paste having main component CuO powder was used to screen-print the conductor pattern on the green sheet, the CuO powder in use being of mean particle size of 5 μm. The vehicle composition for forming paste used a turpentine oil as the solvent and a solution of ethyl cellulose as the organic binder. These were kneaded by a three-roll blending machine with an inorganic composition of the main component of the CuO powder, thereby forming paste for conductors. On the other hand, the insulating paste using the green sheet inorganic component of the same composition as the above was formed by the method the same as that for the conductor paste, and after the CuO paste is screen-process-printed, except for a portion necessary for connection, the insulating layer pattern was screen-process-printed, at which time the printing condition for the CuO paste was to use a stainless screen of 250 meshes and of an emulsion thickness of about 20 μm, which was about 20 μm in thickness after being printed and dried. The insulating layer used a stainless screen of 200 meshes and 20 μm in emulsion thickness, which was adapted to be 45 μm in thickness by repeating twice the printing and drying, and the green sheet was applied at both sides with the aforesaid printing desired times. In addition, when the CuO paste and insulating paste are produced, instead of the turpentine oil and ethyl cellulose, cellulose nitrate as the organic binder and cellulose solvents, such as butyl carbinol or butyl cellulose, may be used and also it is effective to use a surfactant, such as sorbitan alkyl ester and polyoxyethylene alkyl ether. Next, the not-sintered laminate obtained as above-mentioned is subjected to the heat treatment by the binder removing method of the invention. FIG. 3 shows an example of the binder removing system, in which the heat treatment of the temperature profile shown in Zone 1 was carried out in air. The organic binder in the green sheet and the organic component in the paste were almost thermally decomposed and the organic components were removable completely. It is to be noted that the binder removing temperature and the atmosphere are set by previously carrying out thermal analysis to confirm whether or not the binder is completely removed. Accordingly, the decomposition temperature is somewhat different due to the kind of binder, whereby the binder removal setting temperature is of course different. At this time, when the surface of the multilayered body after removal of the binder is observed by a scanning electron microscope, there is found no change in particle size of the starting material for the glass-ceramic material and also the softening of glass component is not confirmed to result in the fact that the organic binder only has been diffused. This means that the binder has been removed at a temperature lower than the softening point of glass component. Next, the multilayered body from which the binder is removed is subjected to the reduction treatment, the condition therefor being shown in Zone 2 in FIG. 3. The reduction has been carried out in the atmosphere of nitrogen gas (flow rate of 2 l/min) including 10% hydrogen gas, in which the reduction temperatures of 200° C., 300° C. and 400° C. have been maintained for about one hour, resulting in the fact that no reduction of CuO to Cu occurs at 200° C. and reduction to Cu occurs at 300° C. and 400° C. Therefore, in a case of using CuO, it is preferable to carry out reduction at a temperature of 300° to 400° C. The sintering has been carried out under conditions depicted in the profile shown in Zone 3, resulting in the fact that a white substrate as obtained and the wiring pattern has a copper color in the interior and upper layer of the substrate.

Next, Tables 3 to 4 show the result of the composition, sheet resistivity, adhesive strength, and soldering wettability (solderability), of CuO paste. In addition, the sheet resistivity was computed from the result of measuring by an ohmmeter a conductor pattern of 250 μm in width and 25 mm in length, the soldering wettability being qualitatively decided based on dipping the substrate in a soldering dip tank. In the Tables 3 and 4, references "Excellent" and "Good" represent practicable ranges respectively. Also, the adhesive strength was measured in such a manner that a lead wire of 0.8 mm in diameter is soldered (solder of Sn and Pb in a ratio of 60 to 40) vertically to a pattern of 2 mm square and then a tensile tester is used to measure the adhesive strength between the substrate and the electrodes.

TABLE 3

| Specimen No. | Additive Name | Additive Weight % | CuO wt % | Sintering Temperature °C. | Sheet Resistivity mΩ/□ | Soldering Wettability | Adhesive Strength kg/mm$^2$ |
|---|---|---|---|---|---|---|---|
| 1 | none | 0 | 100 | 1000 | 3.91 | Excellent | 0.56 |
| 2 | | 1 | 99 | 1000 | 3.82 | Excellent | 0.42 |
| 3 | | 2 | 98 | 1000 | 2.78 | Excellent | 0.58 |
| 4 | $Bi_2O_3$ | 5 | 95 | 1000 | 3.18 | Good | 1.10 |
| 5 | | 10 | 90 | 1000 | 3.61 | Good | 1.21 |
| 6 | | 15 | 85 | 1000 | 3.85 | Good | 0.88 |
| 7 | | 20 | 80 | 1000 | 5.16 | Bad | 0.97 |
| 8 | | 1 | 99 | 1000 | 3.24 | Excellent | 0.5 |
| 9 | | 2 | 98 | 1000 | 3.11 | Excellent | 0.5 |
| 10 | CdO | 5 | 95 | 1000 | 3.84 | Good | 0.71 |
| 11 | | 10 | 90 | 1000 | 3.18 | Good | 0.80 |
| 12 | | 15 | 85 | 1000 | 3.42 | Good | 0.69 |
| 13 | | 20 | 80 | 1000 | 4.05 | Bad | 0.60 |
| 14 | | 1 | 99 | 1000 | 3.50 | Excellent | 0.62 |
| 15 | | 2 | 98 | 1000 | 3.24 | Excellent | 0.65 |
| 16 | $MnO_2$ | 5 | 95 | 1000 | 3.84 | Good | 1.49 |
| 17 | | 10 | 90 | 1000 | 4.55 | Good | 1.50 |
| 18 | | 15 | 85 | 1000 | 5.91 | Bad | 1.69 |
| 19 | | 20 | 80 | 1000 | 8.40 | Bad | 0.80 |
| 20 | | 1 | 99 | 1000 | 3.30 | Excellent | 0.74 |
| 21 | $Al_2O_3$ | 2 | 98 | 1000 | 2.61 | Good | 1.00 |
| 22 | | 5 | 95 | 1000 | 4.12 | Good | 1.18 |
| 23 | | 10 | 90 | 1000 | 6.23 | Bad | 1.90 |
| 24 | | 15 | 85 | 1000 | 10.80 | Bad | 1.60 |
| 25 | | 20 | 80 | 1000 | 24.80 | Bad | 1.38 |

TABLE 4

Sintering Temperature 1000° C.

| Specimen No. | CuO wt % | Additive Amount wt % $Bi_2O_3$ | CdO | $MnO_2$ | $Al_2O_3$ | Sheet Resistivity mΩ/□ | Soldering Wettability | Adhesive Strength kg/mm$^2$ |
|---|---|---|---|---|---|---|---|---|
| 26 | 93 | 2 | 5 | — | — | 3.65 | Good | 0.79 |
| 27 | 90 | 5 | 5 | — | — | 3.88 | Good | 1.01 |
| 28 | 85 | 10 | 5 | — | — | 4.28 | Bad | 1.42 |
| 29 | 93 | 2 | — | 5 | — | 3.78 | Good | 1.24 |
| 30 | 90 | 5 | — | 5 | — | 4.50 | Good | 1.83 |
| 31 | 85 | 10 | — | 5 | — | 6.41 | Good | 2.05 |
| 32 | 93 | 2 | — | — | 5 | 3.64 | Good | 2.10 |
| 33 | 90 | 5 | — | — | 5 | 4.35 | Good | 2.23 |
| 34 | 85 | 10 | — | — | 5 | 8.50 | Bad | 1.50 |
| 35 | 93 | — | 2 | 5 | — | 2.65 | Good | 1.55 |
| 36 | 90 | — | 5 | 5 | — | 3.34 | Good | 1.86 |
| 37 | 85 | — | 10 | 5 | — | 3.54 | Good | 1.81 |
| 38 | 93 | — | 2 | — | 5 | 5.31 | Good | 1.26 |
| 39 | 90 | — | 5 | — | 5 | 6.25 | Good | 1.43 |
| 40 | 85 | — | 10 | — | 5 | 8.35 | Bad | 1.26 |
| 41 | 93 | — | — | 2 | 5 | 4.32 | Good | 1.50 |
| 42 | 90 | — | — | 5 | 5 | 6.02 | Good | 2.01 |
| 43 | 85 | — | — | 10 | 5 | 5.99 | Bad | — |
| 44 | 94 | 2 | 2 | 2 | — | 3.24 | Good | 2.16 |
| 45 | 92 | 2 | 2 | 2 | 2 | 3.54 | Good | 2.33 |
| 46 | 94 | — | 2 | 2 | 2 | 4.06 | Good | 2.05 |
| 47 | 91 | — | 2 | 5 | 2 | 4.59 | Good | 2.65 |
| 48 | 86 | — | 2 | 10 | 2 | 4.83 | Good | 2.54 |
| 49 | 94 | 2 | — | 2 | 2 | 3.44 | Good | 2.01 |
| 50 | 91 | 2 | — | 5 | 2 | 3.79 | Good | 2.78 |
| 51 | 86 | 2 | — | 10 | 2 | 4.03 | Good | 2.15 |
| 52 | 81 | 2 | — | 15 | 2 | 4.51 | Bad | — |

As a result, when $Bi_2O_3$, CdO, $MnO_2$ or $Al_2O_3$ is added, the adhesive strength is seen to be effectively improved. The additive of 2 wt% or more, when added, is effective, so that in consideration of the soldering efficiency and sheet resistivity, the optimum amount of additive is about 5 to 10 wt %. From the measured results of Table 4, it is understood that each additive, even when mixed, has been improved similarly in adhesive strength in comparison with CuO only.

EXAMPLE 2

When the CuO powder and each of $Bi_2O_3$, CdO, $MnO_2$ and $Al_2O_3$ shown in Example 1 were added with the glass powder, the result is shown in Table 5. The glass powder is produced in such a manner that BaO, $B_2O_3$, $SiO_2$, $Al_2O_3$, CaO and MgO were mixed in the order of $BaCO_3$, $H_3BO_3$, $SiO_2$, $Al_2O_3$, $CaCO_3$ and MgO and with a weight % of 30, 50, 5, 10, 2.0 and 2.5 respectively, the mixture was melted at a temperature of 1250° C., dropped into water to be abruptly cooled, and after dried the glass particles were wet-ground, at which time a solvent used methyl alcohol and alumina balls were used to crush the powder for 72 hours. As a result, the glass powder of mean particle size of 2 μm was produced. The result is shown in Table 5.

TABLE 5

| | | Sintering temperature 1000° C. | | | | |
|---|---|---|---|---|---|---|
| Speci-men No. | Glass Amount wt % | Additive Name | Amount wt % | CuO wt % | Sheet Resis-tivity mΩ/□ | Solder-ing Wet-tability | Adhesive Strength kg/mm² |

| Speci-men No. | Glass Amount wt % | Name | Amount wt % | CuO wt % | Sheet Resis-tivity mΩ/□ | Solder-ing Wet-tability | Adhesive Strength kg/mm² |
|---|---|---|---|---|---|---|---|
| 3 | 0 | $Bi_2O_3$ | 2 | 98 | 2.78 | Excellent | 0.58 |
| 53 | 1 | " | 2 | 97 | 2.50 | Excellent | 1.10 |
| 54 | 2 | " | 2 | 96 | 2.61 | Excellent | 1.53 |
| 55 | 5 | " | 2 | 93 | 2.96 | Good | 2.20 |
| 56 | 10 | " | 2 | 88 | 3.12 | Bad | 2.32 |
| 57 | 15 | " | 2 | 83 | 4.55 | Bad | — |
| 58 | 1 | " | 5 | 94 | 3.54 | Excellent | 1.55 |
| 59 | 2 | " | 5 | 93 | 3.02 | Good | 1.83 |
| 60 | 5 | " | 5 | 90 | 3.10 | Good | 2.40 |
| 61 | 10 | " | 5 | 85 | 3.33 | Bad | 2.00 |
| 62 | 15 | " | 5 | 80 | 4.54 | Bad | — |
| 63 | 1 | CdO | 2 | 97 | 2.78 | Excellent | 0.73 |
| 64 | 2 | " | 2 | 96 | 3.18 | Good | 0.65 |
| 65 | 5 | " | 2 | 93 | 3.61 | Good | 1.10 |
| 66 | 10 | " | 2 | 88 | 3.82 | Bad | 1.35 |
| 67 | 15 | " | 2 | 83 | 6.15 | Bad | — |
| 68 | 1 | $MnO_2$ | 2 | 97 | 3.35 | Excellent | 0.98 |
| 69 | 2 | " | 2 | 96 | 3.34 | Excellent | 1.78 |
| 70 | 5 | " | 2 | 93 | 4.18 | Good | 2.78 |
| 71 | 10 | " | 2 | 88 | 5.79 | Bad | 2.65 |
| 72 | 15 | " | 2 | 83 | 9.10 | Bad | — |
| 73 | 1 | $Al_2O_3$ | 2 | 97 | 2.73 | Excellent | 1.55 |
| 74 | 2 | " | 2 | 96 | 2.61 | Good | 1.96 |
| 75 | 5 | " | 2 | 93 | 4.12 | Good | 2.73 |
| 76 | 10 | " | 2 | 88 | 6.23 | Bad | 2.55 |
| 77 | 15 | " | 2 | 83 | 10.8 | Bad | — |

As a result, it is seen that the glass powder is added to effectively improve the adhesive strength. In addition, the addition of glass powder of 1 wt % or more is effective, while, addition of the same of 10 wt % or more deteriorates the solder wettability. Hence, it is considered that an optimum amount is about 2 to 5 wt %. Alternatively, the component other than BaO, $B_2O_3$, CaO, MgO, $Al_2O_3$ and $SiO_2$ in this embodiment of course is acceptable unless the sintering in the reducing atmosphere will oxidize CuO.

EXAMPLE 3

Figure 2:
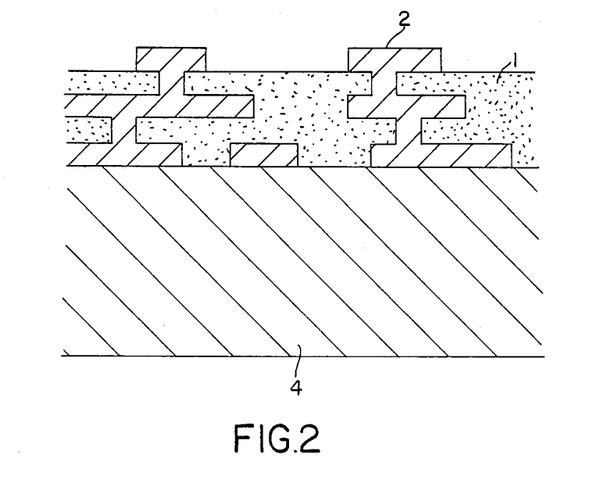
FIG. 2 is a sectional view of a modified embodiment of a ceramic laminate body of the invention.
Figure 4:
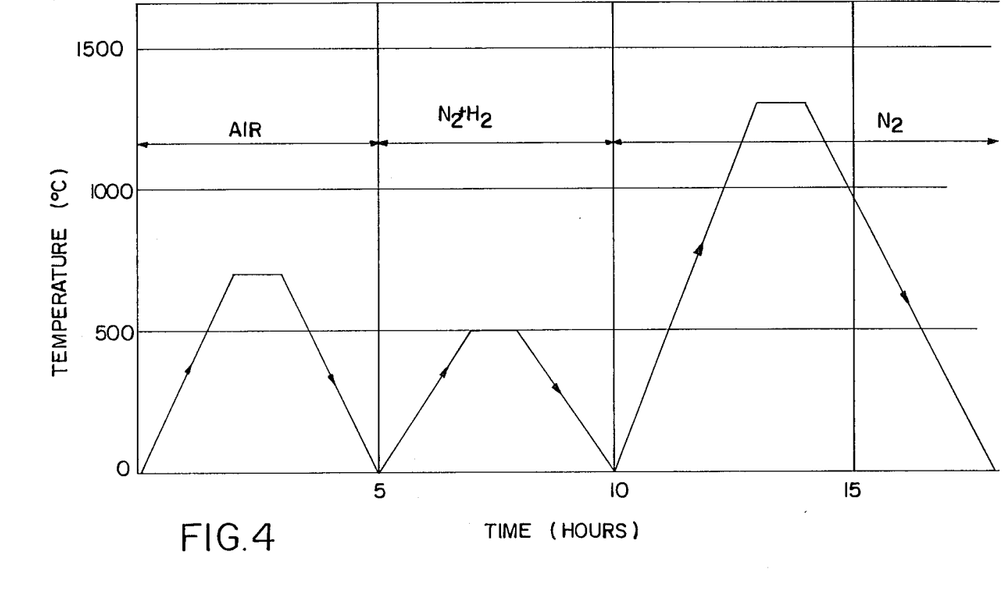
FIG. 4 is a graph exemplary of the temperature and atmosphere profile of the same.

In this example, the ceramic substrate already sintered was used as the base. In other words, the alumina powder is the main component and is added with SiO, MgO or CaO powder as a sintering assistant, so that alumina as a whole is 96% by weight percent (called the 96% alumina) and the substrate is sintered at a temperature of 1600° C., which is of 50×50 in width and 0.8 mm in thickness. Then, the conductor paste of the main component CoO, $Fe_2O_3$ and NiO, and borosilicate glass (shown in Table 1) the same as Example 1 are mixed at a mixing ratio of 30 to 70 wt % with respect to alumina to be mixed, so that the mixture is used as the insulating paste and is repeatedly printed the desired times on the alumina substrate and multilayered. FIG. 2 shows this construction in section, in which reference numeral 1 designates a glass-ceramic layer in this embodiment, 2 designates a base metal metallized layer, and 4 designates a sintered 96% alumina substrate. The heat treatment for binder removal, reduction and firing, was as aforesaid carried out by the temperature profile shown in FIG. 4. The example 3 is different from the examples 1 and 2 in that the reducing temperature is raised to a temperature (about 500° C.) to enable reduction of CoO, NiO and $Fe_2O_3$, and the baking temperature is raised to 1000° to 1400° C. because Co, Ni, and Fe of high melting point in comparison with Cu are used. The evaluation of the performance of the multilayer substrate obtained as above-mentioned are shown in Tables 6 to 8. In addition, since Fe and Co cannot be soldered, the wiring pattern of the main component of Co or Fe has been applied with electroless Cu plating, and subjected to heat treatment at a temperature of 500° C. and in vacuum, so that the adhesive property between Co or Fe and the Cu plated layer has been improved and then the adhesive strength of insulating layer and electrode has been measured.

TABLE 6

| Speci-men No. | Additive Name | Amount wt % | CoO wt % | Sintering Tempera-ture °C. | Adhesive Strength kg/mm² |
|---|---|---|---|---|---|
| 78 | none | 0 | 100 | 1200 | 0.3 |
| 79 | | 1 | 99 | 1200 | 0.35 |
| 80 | | 2 | 98 | 1200 | 0.88 |
| 81 | | 5 | 95 | 1200 | 0.95 |
| 82 | $Bi_2O_3$ | 10 | 90 | 1200 | 0.78 |
| 83 | | 15 | 85 | 1200 | 0.55 |
| 84 | | 20 | 80 | 1200 | 0.78 |
| 85 | | 1 | 99 | 1200 | 0.15 |
| 86 | | 2 | 98 | 1200 | 0.63 |
| 87 | | 5 | 95 | 1200 | 0.45 |
| | CdO | | | | |
| 88 | | 10 | 90 | 1200 | 0.58 |
| 89 | | 15 | 85 | 1200 | 0.78 |
| 90 | | 20 | 80 | 1200 | 0.25 |
| 91 | | 1 | 99 | 1200 | 0.33 |
| 92 | | 2 | 98 | 1200 | 0.58 |
| 93 | | 5 | 95 | 1200 | 0.78 |
| | $MnO_2$ | | | | |
| 94 | | 10 | 90 | 1200 | 1.03 |
| 95 | | 15 | 85 | 1200 | 0.59 |
| 96 | | 20 | 80 | 1200 | 0.35 |
| 97 | | 1 | 99 | 1200 | 0.33 |
| 98 | | 2 | 98 | 1200 | 0.47 |

TABLE 6-continued

| Specimen No. | Additive Name | Amount wt % | CoO wt % | Sintering Temperature °C. | Adhesive Strength kg/mm² |
|---|---|---|---|---|---|
| 99 | Al₂O₃ | 5 | 95 | 1200 | 0.78 |
| 100 | Al₂O₃ | 10 | 90 | 1200 | 0.95 |
| 101 | | 15 | 85 | 1200 | 0.38 |
| 102 | | 20 | 80 | 1200 | 0.65 |
| 103 | | 1 | 99 | 1200 | 0.25 |
| 104 | CuO | 2 | 98 | 1200 | 0.38 |
| 105 | | 5 | 95 | 1200 | 0.79 |
| 106 | | 10 | 90 | 1200 | 1.05 |
| 107 | | 15 | 85 | 1200 | 1.22 |
| 108 | | 20 | 80 | 1200 | 0.63 |

TABLE 7

| Specimen No. | Additive Name | Amount wt % | Fe₂O₃ wt % | Sintering Temperature °C. | Adhesive Strength kg/mm² |
|---|---|---|---|---|---|
| 109 | none | 0 | 100 | 1400 | 0.33 |
| 110 | | 1 | 99 | 1400 | 0.44 |
| 111 | | 2 | 98 | 1400 | 0.39 |
| 112 | | 5 | 95 | 1400 | 0.78 |
| 113 | Bi₂O₃ | 10 | 90 | 1400 | 0.81 |
| 114 | | 15 | 85 | 1400 | 0.70 |
| 115 | | 20 | 80 | 1400 | 0.55 |
| 116 | | 1 | 99 | 1400 | 0.51 |
| 117 | | 2 | 98 | 1400 | 0.75 |
| 118 | CdO | 5 | 95 | 1400 | 0.98 |
| 119 | | 10 | 90 | 1400 | 1.11 |
| 120 | | 15 | 85 | 1400 | 0.55 |
| 121 | | 20 | 80 | 1400 | 0.78 |
| 122 | | 1 | 99 | 1400 | 0.41 |
| 123 | | 2 | 98 | 1400 | 0.75 |
| 124 | | 5 | 95 | 1400 | 0.88 |
| 125 | MnO₂ | 10 | 90 | 1400 | 0.66 |
| 126 | | 15 | 85 | 1400 | 0.54 |
| 127 | | 20 | 80 | 1400 | 0.49 |
| 128 | | 1 | 99 | 1400 | 0.51 |
| 129 | Al₂O₃ | 2 | 98 | 1400 | 0.99 |
| 130 | Al₂O₃ | 5 | 95 | 1400 | 0.85 |
| 131 | | 0.5 10 | 90 | 1400 | 1.41 |
| 132 | | 15 | 85 | 1400 | 1.20 |
| 133 | | 20 | 80 | 1400 | 1.01 |
| 134 | | 1 | 99 | 1400 | 0.59 |
| 135 | | 2 | 98 | 1400 | 0.89 |
| 136 | | 5 | 95 | 1400 | 1.25 |
| 137 | CuO | 10 | 90 | 1400 | 1.17 |
| 138 | | 15 | 85 | 1400 | 1.10 |
| 139 | | 20 | 80 | 1400 | 1.06 |

TABLE 8

| Specimen No. | Additive Name | Amount wt % | NiO | Sintering Temperature °C. | Solder-ing Adhesive Wettability | Strength kg/mm² |
|---|---|---|---|---|---|---|
| 140 | | 0 | 100 | 1000 | Excellent | 0.54 |
| 141 | | 1 | 99 | | Excellent | 1.20 |
| 142 | | 2 | 98 | | Excellent | 1.88 |
| 143 | Bi₂O₃ | 5 | 95 | 1000 | Good | 2.78 |
| 144 | | 10 | 90 | | Good | 2.87 |
| 145 | | 15 | 85 | | Bad | 2.83 |
| 146 | | 20 | 80 | | Bad | 2.79 |
| 147 | | 1 | 99 | | Excellent | 0.88 |
| 148 | | 2 | 98 | | Excellent | 0.95 |
| 149 | CdO | 5 | 95 | 1000 | Excellent | 1.35 |
| 150 | | 10 | 90 | | Good | 1.83 |
| 151 | | 15 | 85 | | Bad | 1.55 |
| 152 | | 20 | 80 | | Bad | 1.95 |
| 153 | | 1 | 99 | | Excellent | 1.20 |
| 154 | | 2 | 98 | | Excellent | 1.65 |
| 155 | MnO₂ | 5 | 95 | 1000 | Excellent | 1.38 |
| 156 | | 10 | 90 | | Good | 1.78 |
| 157 | | 15 | 85 | | Bad | 1.65 |
| 158 | | 20 | 80 | | Bad | 1.53 |
| 159 | | 1 | 99 | | Excellent | 1.10 |
| 160 | Al₂O₃ | 2 | 98 | | Excellent | 1.54 |
| 161 | Al₂O₃ | 5 | 95 | 1000 | Good | 1.98 |
| 162 | | 10 | 90 | | Good | 2.78 |
| 163 | | 15 | 85 | | Bad | 2.54 |
| 164 | | 20 | 80 | | Bad | 1.89 |
| 165 | | 1 | 99 | | Excellent | 1.43 |
| 166 | | 2 | 98 | | Excellent | 2.75 |
| 167 | CuO | 5 | 95 | 1000 | Excellent | 3.01 |
| 168 | | 10 | 90 | | Good | 3.25 |
| 169 | | 15 | 85 | | Good | 2.98 |
| 170 | | 20 | 80 | | Good | 2.54 |

As seen from this example, even when CoO, NiO and Fe₂O₃ were used, a result the same as when using CuO was obtained, which clarified that metallization of base metal of a low cost was performed easily on the multi-layered ceramic substrate. In addition, in Tables 6 to 8, Bi₂O₃, CdO, MnO₂, Al₂O₃ or CuO were used independently as the additive, but the combination thereof exhibited a similar tendency.

EXAMPLE 4

In the series of CoO, NiO and Fe₂O₃ added with Bi₂O₃, CdO, MnO₂, Al₂O₃ and CuO as the additive, the effect of adding to them the glass powder in Example 2 was examined, which is shown in Tables 9 to 11.

TABLE 9

| Specimen No. | Amount of Glass wt % | Bi₂O₃ wt % | Fe₂O₃ wt % | Sintering Temperature °C. | Adhesive Strength kg/mm² |
|---|---|---|---|---|---|
| 171 | 0 | 2 | 98 | 1400 | 0.39 |
| 172 | 1 | 2 | 97 | 1400 | 1.15 |
| 173 | 2 | 2 | 96 | 1400 | 1.53 |
| 174 | 5 | 2 | 93 | 1400 | 1.88 |
| 175 | 10 | 2 | 88 | 1400 | 2.12 |
| 176 | 15 | 2 | 83 | 1400 | 1.66 |
| 177 | 20 | 2 | 78 | 1400 | 1.30 |
| 178 | 1 | 5 | 94 | 1400 | 1.01 |
| 179 | 2 | 5 | 93 | 1400 | 1.73 |
| 180 | 5 | 5 | 90 | 1400 | 2.10 |
| 181 | 10 | 5 | 85 | 1400 | 2.00 |
| 182 | 15 | 5 | 80 | 1400 | 1.53 |
| 183 | 20 | 5 | 75 | 1400 | 1.58 |

TABLE 10

| Specimen No. | Amount of Glass wt % | Bi₂O₃ wt % | CoO wt % | Sintering Temperature °C. | Adhesive Strength kg/mm² |
|---|---|---|---|---|---|
| 184 | 0 | 2 | 98 | 1200 | 0.88 |
| 185 | 1 | 2 | 97 | 1200 | 0.75 |
| 186 | 2 | 2 | 96 | 1200 | 1.23 |
| 187 | 5 | 2 | 93 | 1200 | 1.55 |
| 188 | 10 | 2 | 88 | 1200 | 1.45 |
| 189 | 15 | 2 | 83 | 1200 | 1.62 |
| 190 | 20 | 2 | 78 | 1200 | 1.33 |
| 191 | 1 | 5 | 94 | 1200 | 0.93 |
| 192 | 2 | 5 | 93 | 1200 | 1.25 |
| 193 | 5 | 5 | 90 | 1200 | 1.46 |

TABLE 10-continued

| Specimen No. | Amount of Glass wt % | Bi₂O₃ wt % | CoO wt % | Sintering Temperature °C. | Adhesive Strength kg/mm² |
| --- | --- | --- | --- | --- | --- |
| 194 | 10 | 5 | 85 | 1200 | 1.88 |
| 195 | 15 | 5 | 80 | 1200 | 1.38 |
| 196 | 20 | 5 | 75 | 1200 | 1.01 |

TABLE 11

| Specimen No. | Amount of Glass wt % | Bi₂O₃ wt % | NiO wt % | Baking Temperature °C. | Sintering Wettability | Adhesive Strength kg/mm₂ |
| --- | --- | --- | --- | --- | --- | --- |
| 197 | 0 | 2 | 98 | 1000 | Excellent | 1.88 |
| 198 | 1 | 2 | 97 | 1000 | Good | 2.78 |
| 199 | 2 | 2 | 96 | 1000 | Good | 3.12 |
| 200 | 5 | 2 | 93 | 1000 | Bad | 3.34 |
| 201 | 10 | 2 | 88 | 1000 | Bad | — |
| 202 | 15 | 2 | 83 | 1000 | Bad | — |
| 203 | 1 | 5 | 94 | 1000 | Excellent | 2.12 |
| 204 | 2 | 5 | 93 | 1000 | Excellent | 2.72 |
| 205 | 5 | 5 | 90 | 1000 | Bad | 3.35 |
| 206 | 10 | 5 | 85 | 1000 | Bad | 3.93 |
| 207 | 15 | 5 | 80 | 1000 | Bad | — |

As seen from Tables 8 to 11, the addition of glass powder as the same as CuO is expected to improve the adhesive strength. Alternatively, the metal oxide other than Bi₂O₃ in this example may be used to obtain the same effect, or glass only, even when added to the base metal, is also effective.

Although several examples have been described, they are merely exemplary of the invention and are not to be construed as limiting, the invention being defined solely by the appended claims.

What is claimed is:

1. A method of manufacturing a multilayered ceramic body, comprising the steps of:
   preparing a multilayered body comprising at least one insulating layer made of an insulating paste comprising an organic binder and a mixture of ceramic and glass, and at least one conductor layer made of a conductor paste having an organic binder and an inorganic component which comprises at least one base metal oxide selected from the group consisting of CuO, NiO, CoO and Fe₂O₃;
   removing the organic binder from each of said insulating and conductor pastes by heating said multilayered body in an oxidizing atmosphere at a temperature lower than the sintering temperature of said insulating paste;
   reducing said base metal oxide to a base metal by heating said multilayered body in a reducing atmosphere of a mixed gas of hydrogen and nitrogen at a temperature lower than the sintering temperature of said insulating paste; and
   sintering said multilayered body by firing said multilayered body in a nitrogen atmosphere.

2. The method according to claim 1, wherein the heating temperature in said binder removing step is lower than the lower of the sintering temperature of said insulating paste and the softening temperature of the glass in said insulating paste.

3. The method according to claim 1, wherein the heating temperature in said reducing step is lower than the lower of the sintering temperature of said insulating paste and the softening temperature of the glass in said insulating paste.

4. The method as set forth in claim 1, wherein said conductor paste comprises: an inorganic component comprising CuO powder at 85 to 98 wt % and at least one of Bi₂O₃, CdO, MnO₂ and Al₂O₃, at 2 to 15 wt %; an organic binder; and a solvent for the binder.

5. The method as set forth in claim 1, wherein said conductor paste comprises: an inorganic component comprising CuO powder at 75 to 97 wt %, glass powder at 1 to 10 wt %, and at least one of Bi₂O₃, CdO, MnO₂ and Al₂O₃, at 2 to 15 wt %; an organic binder; and a solvent for the binder.

6. The method as set forth in claim 5, wherein said glass powder comprises an oxide selected from the group consisting of BaO, B₂O₃, CaO, MgO, Al₂O₃, and SiO₂.

7. The method as set forth in claim 1, wherein said conductor paste comprises: an inorganic component comprising a powder of at least one of NiO, Fe₂O₃ and CoO, at 85 to 98 wt %, and at least one of Bi₂O₃, CdO, MnO₂, Al₂O₃, and CuO, at 2 to 15 wt %; an organic binder; and a solvent for the binder.

8. The method as set forth in claim 1, wherein said conductor paste comprises: an inorganic component comprising a powder of at least one of NiO, Fe₂O₃ and CoO, at 75 to 97 wt %, a glass powder at 1 to 10 wt %, and at least one of Bi₂O₃, CdO, MnO₂, Al₂O₃ and CuO, at 2 to 15 wt %; an organic binder; and a solvent for the binder.

9. The method as set forth in claim 8, wherein said glass powder comprises an oxide selected from the group consisting of BaO, B₂O₃, CaO, MgO, Al₂O₃ and SiO₂.

10. A method of manufacturing a multilayered ceramic body, comprising the steps of:
   preparing a multilayered body comprising a main substrate and at least one laminated body formed on at least one of opposite surfaces of said main substrate, said laminated body comprising a plurality of insulating layers each made of an insulating paste comprising an organic binder and a mixture of ceramic and glass, a plurality of conductor layers each made of a conductor paste having an organic binder and an inorganic component which comprises at least one base metal oxide selected from the group consisting of CuO, NiO, CoO and Fe₂O₃, and through holes provided in said insulating layers and filled with said conductor paste for connecting said conductor layers;
   removing the organic binder from each of said insulating and conductor pastes by heating said multilayered body in an oxidizing atmosphere at a temperature lower than the sintering temperature of said insulating paste;
   reducing said base metal oxide to a base metal by heating said multilayered body in a reducing atmosphere of a mixed gas of hydrogen and nitrogen at a temperature lower than the sintering temperature of said insulating paste; and
   sintering said multilayered body by firing said multilayered body in a nitrogen atmosphere.

11. The method according to claim 10, wherein the heating temperature in said binder removing step is lower than the lower of the sintering temperature of said insulating paste and the softening temperature of the glass in said insulating paste.

12. The method according to claim 10, wherein the heating temperature in said reducing step is lower than the lower of the sintering temperature of said insulating paste and the softening temperature of the glass in said insulating paste.

13. The method as set forth in claim 10, wherein said main substrate has the same composition as that of said insulating layer.

14. The method as set forth in claim 10, wherein said main substrate is an already sintered substrate comprising one of $Al_2O_3$, SiC, BeO, AlN and $MgAl_2O_4$.

15. The method as set forth in claim 10, wherein said conductor paste comprises: an inorganic component comprising CuO powder at 85 to 98 wt % and at least one of $Bi_2O_3$, CdO, $MnO_2$ and $Al_2O_3$, at 2 to 15 wt %; an organic binder; and a solvent for the binder.

16. The method as set forth in claim 10, wherein said conductor paste comprises: an inorganic component comprising CuO powder at 75 to 97 wt %, glass powder at 1 to 10 wt %, and at least one of $Bi_2O_3$, CdO, $MnO_2$ and $Al_2O_3$, at 2 to 15 wt %; an organic binder; and a solvent for the binder.

17. The method as set forth in claim 37, wherein said glass powder comprises an oxide selected from the group consisting of BaO, $B_2O_3$, CaO, MgO, $Al_2O_3$, and $SiO_2$.

18. The method as set forth in claim 10, wherein said conductor paste comprises: an inorganic component comprising a powder of at least one of NiO, $Fe_2O_3$ and CoO, at 85 to 98 wt %, and at least one of $Bi_2O_3$, CdO, $MnO_2$, $Al_2O_3$, and CuO, at 2 to 15 wt %; an organic binder; and a solvent for the binder.

19. The method as set forth in claim 10, wherein said conductor paste comprises: an inorganic component comprising a powder of at least one of NiO, $Fe_2O_3$ and CoO, at 75 to 97 wt %, a glass powder at 1 to 10 wt %, and at least one of $Bi_2O_3$, CdO, $MnO_2$, $Al_2O_3$ and CuO, at 2 to 15 wt %; an organic binder; and a solvent for the binder.

20. The method as set forth in claim 19, wherein said glass powder comprises an oxide selected from the group consisting of BaO, $B_2O_3$, CaO, MgO, $Al_2O_3$ and $SiO_2$.

21. A method of manufacturing a multilayered ceramic body, comprising the steps of:
preparing a multilayered body comprising a main substrate and at least one laminated body formed on at least one of opposite surfaces of said main substrate, said laminated body comprising at least one insulating layer made of an insulating paste comprising an organic binder and a mixture of ceramic and glass, and at least one conductor layer made of a conductor paste having an organic binder and an inorganic component which comprises at least one base metal oxide selected from the group consisting of CuO, NiO, CoO and $Fe_2O_3$;
removing the organic binder from each of said insulating and conductor pastes by heating said multilayered body in an oxidizing atmosphere at a temperature lower than the sintering temperature of said insulating paste;
reducing said base metal oxide to a base metal by heating said multilayered body in a reducing atmosphere of a mixed gas of hydrogen and nitrogen at a temperature lower than the sintering temperature of said insulating paste; and
sintering said multilayered body by firing said multilayered body in a nitrogen atmosphere.

22. The method according to claim 21, wherein the heating temperature in said binder removing step is lower than the lower of the sintering temperature of said insulating paste and the softening temperature of the glass in said insulating paste.

23. The method according to claim 21, wherein the heating temperature in said reducing step is lower than the lower of the sintering temperature of said insulating paste and the softening temperature of the glass in said insulating paste.

24. The method as set forth in claim 21, wherein said main substrate has the same composition as that of said insulating layer.

25. The method as set forth in claim 21, wherein said main substrate is an already sintered substrate comprising one of $Al_2O_3$, SiC, BeO, AlN and $MgAl_2O_4$.

26. The method as set forth in claim 21, wherein an outermost layer of said laminated body is one of said insulating layers, and wherein said method further comprises, after said sintering step, the steps of: forming a conductor layer made of a conductor paste whose inorganic component comprises said base metal on said outermost insulating layer; and firing said conductor layer in a neutral atmosphere to sinter said conductor layer.

27. The method as set forth in claim 21, wherein said conductor paste comprises: an inorganic component comprising CuO powder at 85 to 98 wt % and at least one of $Bi_2O_3$, CdO, $MnO_2$ and $Al_2O_3$, at 2 to 15 wt %; an organic binder; and a solvent for the binder.

28. The method as set forth in claim 21, wherein said conductor paste comprises: an inorganic component comprising CuO powder at 75 to 97 wt %; glass powder at 1 to 10 wt %, and at least one of $Bi_2O_3$, CdO, $MnO_2$ and $Al_2O_3$, at 2 to 15 wt %; an organic binder; and a solvent for the binder.

29. The method as set forth in claim 28, wherein said glass powder comprises an oxide selected from the group consisting of BaO, $B_2O_3$, CaO, MgO, $Al_2O_3$, and $SiO_2$.

30. The method as set forth in claim 21, wherein said conductor paste comprises: an inorganic component comprising a powder of at least one of NiO, $Fe_2O_3$ and CoO, at 85 to 98 wt %, and at least one of $Bi_2O_3$, CdO, $MnO_2$, $Al_2O_3$, and CuO, at 2 to 15 wt %; an organic binder; and a solvent for the binder.

31. The method as set forth in claim 21, wherein said conductor paste comprises: an inorganic component comprising a powder of at least one of NiO, $Fe_2O_3$ and CoO, at 75 to 97 wt %, a glass powder at 1 to 10 wt %, and at least one of $Bi_2O_3$, CdO, $MnO_2$, $Al_2O_3$ and CuO, at 2 to 15 wt %; an organic binder; and a solvent for the binder.

32. The method as set forth in claim 31, wherein said glass powder comprises an oxide selected from the group consisting of BaO, $B_2O_3$, CaO, MgO, $Al_2O_3$ and $SiO_2$.

33. The method according to claim 1 wherein said mixture of ceramic and glass each comprises at least one member selected from the group consisting of $Al_2O_3$, BaO, $B_2O_3$, $SiO_2$, CaO, MgO, $Na_2O$, $Ta_2O_5$, $Nb_2O_5$, $Li_2O$ and $K_2O$.

34. The method according to claim 10 wherein said mixture of ceramic and glass each comprises at least one member selected from the group consisting of $Al_2O_3$, BaO, $B_2O_3$, $SiO_2$, CaO, MgO, $Na_2O$, $Ta_2O_5$, $Nb_2O_5$, $Li_2O$ and $K_2O$.

35. The method according to claim 21 wherein said mixture of ceramic and glass each comprises at least one member selected from the group consisting of $Al_2O_3$, BaO, $B_2O_3$, $SiO_2$, CaO, MgO, $Na_2O$, $Ta_2O_5$, $Nb_2O_5$, $Li_2O$ and $K_2O$.

* * * * *